United States Patent [19]
Goto et al.

[11] 4,377,031
[45] Mar. 22, 1983

[54] METHOD OF MAKING SCHOTTKY BARRIER DIODE BY SELECTIVE BEAM-CRYSTALLIZED POLYCRYSTALLINE/AMORPHOUS LAYER

[75] Inventors: Hiroshi Goto, Yokohama; Kenji Sugishima, Kawasaki, both of Japan

[73] Assignee: Fujitsu Limited, Kawasaki, Japan

[21] Appl. No.: 249,833

[22] Filed: Apr. 1, 1981

[30] Foreign Application Priority Data

Apr. 10, 1980 [JP] Japan .................................. 55-47347

[51] Int. Cl.³ ..................... H01L 21/26; H01L 21/263
[52] U.S. Cl. ................................... 29/576 B; 148/1.5; 148/187; 427/53.1; 357/91; 357/15
[58] Field of Search ............... 148/1.5, 187; 29/576 B; 427/53.1; 357/91, 15

[56] References Cited

U.S. PATENT DOCUMENTS

| | | | |
|---|---|---|---|
| 3,771,026 | 11/1973 | Asai et al. | 317/234 R |
| 4,059,461 | 11/1977 | Fan et al. | 148/1.5 |
| 4,187,126 | 2/1980 | Radd et al. | 148/1.5 |
| 4,267,011 | 5/1981 | Shibata et al. | 29/571 |
| 4,269,631 | 5/1981 | Anantha et al. | 148/1.5 |
| 4,292,091 | 9/1981 | Togei | 148/1.5 |

OTHER PUBLICATIONS

Anantha et al., IBM–TDB, 22, (1979), 575.
Celler et al., Appl. Phys. Letts., 32, (1978), 464.
Chu et al., IBM–TDB, 22 (1980), May.
Poate et al., Appl. Phys. Letts., 33 (1978), 918.
Petersen, IBM–TDB, 22 (Apr. 1980), 5054.

Primary Examiner—Upendra Roy
Attorney, Agent, or Firm—Staas & Halsey

[57] ABSTRACT

Generally, a complicated process is required in manufacturing a semiconductor device containing a Schottky barrier diode and a polycrystalline silicon layer which prevents excessive reaction of the aluminum electrode and silicon material involved. Because of the inability of the aluminum electrode to provide a good Schottky barrier by its contact with the polycrystalline silicon layer, it is required to directly contact the electrode with a monocrystalline silicon semiconductor layer or substrate. According to the present invention, this process is simplified by monocrystallizing the polycrystalline silicon layer at least in the region in which a Schottky barrier diode is to be formed by annealing the silicon layer in said region by laser beam irradiation and applying an aluminum electrode thereto.

7 Claims, 10 Drawing Figures

METHOD OF MAKING SCHOTTKY BARRIER DIODE BY SELECTIVE BEAM-CRYSTALLIZED POLYCRYSTALLINE/AMORPHOUS LAYER

BACKGROUND OF THE INVENTION

1. Field of the Invention

The present invention relates to a method of manufacturing a semiconductor device, and more particularly to a method of manufacturing a semiconductor device containing a Schottky barrier diode.

2. Description of the Prior Art

In the prior art for manufacturing a bipolar semiconductor device for example, it has been a common practice to form a polycrystalline or amorphous silicon layer directly under the electrode to prevent aluminum or aluminum-containing material used in the electrode from reacting with the silicon involved and short-circuiting the emitter-base and base-collector junctions. It is also a practice to use a Schottky barrier diode in such a bipolar semiconductor device, in which case, however, there must be no polycrystalline silicon layer in the metal-semiconductor contact area. In the contact area constituting a Schottky barrier, if the semiconductor is polycrystalline or amorphous, a uniform contact between the metal and the semiconductor is prevented due to varied crystal grain sizes of the semiconductor. This makes it difficult to attain the properties of the Schottky barrier diode desired for its proper operation with good reproducibility. Thus, an improved manufacturing process is required.

FIGS. 1 to 5 each are a cross-sectional view of a portion of the bipolar semiconductor device mentioned above in certain sequential stages of its manufacturing process which is useful in explaining a typical conventional method of manufacturing the same. The manufacturing method of the prior art will now be described with reference to these drawings.

Referring to FIG. 1:

(1) On a silicon semiconductor substrate 1, an n+-type buried layer 2 is formed, followed by the epitaxial growth of an n-type silicon semiconductor layer 3, in which are formed a p-type isolated region 4 contacting the substrate 1 and a p-type base region 5. The surface is covered with a field oxide layer 6. Reference characters B, S and C denote a region in which a base, a Schottky barrier diode and a collector contact are to be formed, respectively.

(2) The field oxide layer 6 is patterned by ordinary photolithography to provide windows 6S, 6E, 6B and 6C in which a Schottky barrier diode, an emitter, a base contact and a collector contact are to be formed, respectively. The etching process is done until the field oxide layer 6 is as thin as approximately 1,000 Å as shown by reference character t. Reference numeral 7 denotes a photoresist layer used as a mask in this process.

Referring to FIG. 2:

(3) A second photoresist layer 8 is formed which has a pattern for exposing the bottom of the windows 6E, 6B and 6C in which an emitter, a base contact and a collector contact are to be formed, respectively.

(4) The field oxide layer 6 is etched, with the second photoresist layer 8 serving as a mask, to expose the bottom of the windows 6E, 6B and 6C in which an emitter, a base contact and a collector contact are to be formed, respectively.

Referring to FIG. 3:

(5) The photoresist layers 7 and 8 are all removed.

(6) A polycrystalline silicon layer 11 of approximately 800 Å thick is formed by the chemical vapor growth method in which monosilane $SiH_4$ is decomposed.

(7) A new mask of photoresist film is formed, which is utilized in introducing an impurity of the conductivity opposite to that of the base region to form an emitter region 9 and a collector contact region 10.

(8) A photoresist layer 12 is formed that has an opening for exposing the top surface of the field oxide layer 6 in the window 6S in which a Schottky barrier diode is to be formed.

Referring to FIG. 4:

(9) The polycrystalline silicon layer 11 is patterned, with the photoresist layer 12 serving as a mask, to expose the top surface of the field oxide layer 6 in the window 6S.

Referring to FIG. 5:

(10) The field oxide layer 6 is etched to complete the window 6S in which a Schottky barrier diode is to be formed. In etching the field oxide layer 6, a new photoresist layer, if necessary, is to be formed.

(11) The photoresist layer 12 is removed, and a first aluminum layer electrode is attached. Wiring and some other required work will complete the semiconductor device product.

According to the prior art, attachment of polycrystalline silicon onto the substrate surface where a Schottky barrier diode is to be formed can be avoided only when two photoresist layers are used. The photoresist material used must be of the negative type.

Generally, the positive type photoresist is more suitable for attaining microfabrication than the negative type, but if the positive type is applied in two layers, the first layer is melted when the second layer is coated thereupon. Thus this type of photoresist cannot be used in the process of the prior art.

SUMMARY OF THE INVENTION

An object of the present invention is to provide an easy and simple method of manufacturing a bipolar semiconductor device containing a Schottky barrier diode in a process substantially the same as the conventional process for manufacturing bipolar semiconductor devices, but without using two layers of photoresist material, without leaving part of the insulating layer such as silicon dioxide film in the window in which a Schottky barrier diode is to be formed and hence without the need of the two-step process to complete the window associated with the conventional method.

DESCRIPTION OF THE PREFERRED EMBODIMENTS

FIGS. 6 to 10 each are a cross-sectional view of a portion of a semiconductor device in certain sequential stages of its manufacturing process which are useful in explaining an embodiment of the present invention. A description of the present invention will now be given in reference to these drawings.

Figure 1:
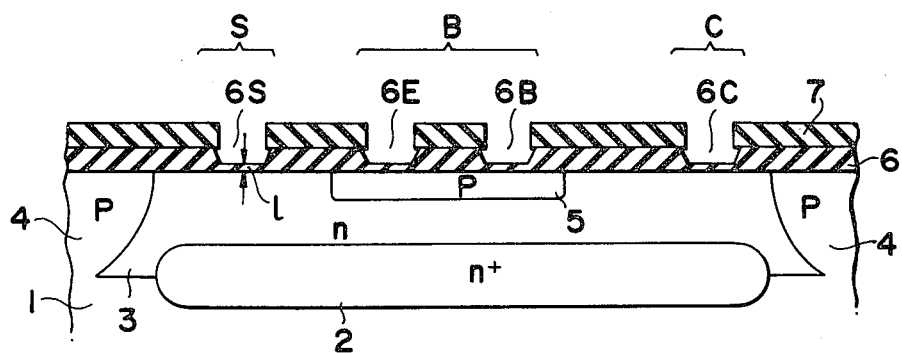
FIG. 1 is a cross-sectional view of a portion of a semiconductor device in a certain stage of its manufacturing process which is useful in explaining the conventional manufacturing method.
Figure 2:
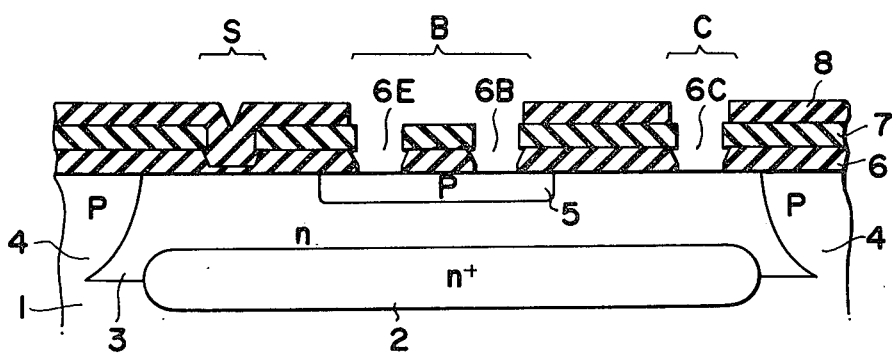
FIG. 2 is a cross-sectional view of said portion of the semiconductor device in a subsequent stage of its manufacturing process which is useful in explaining the conventional manufacturing method.
Figure 3:
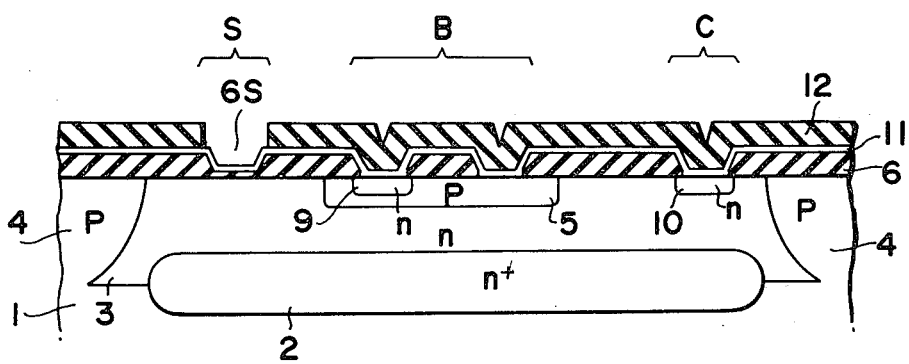
FIG. 3 is a cross-sectional view of said portion of the semiconductor device in another subsequent stage of its manufacturing process which is useful in explaining the conventional manufacturing method.
Figure 4:
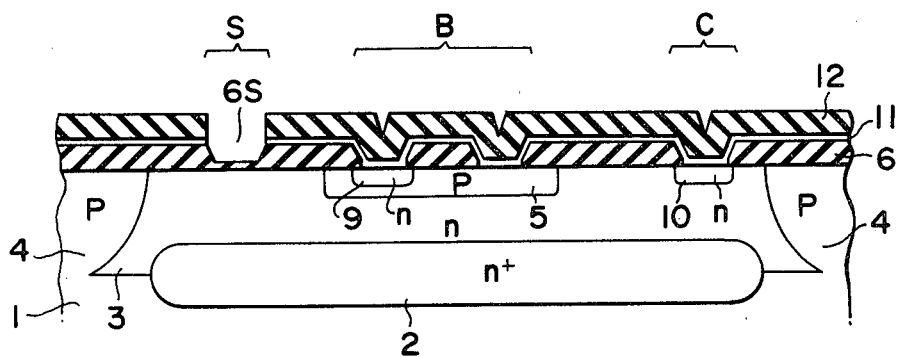
FIG. 4 is a cross-sectional view of said portion of the semiconductor device in still another subsequent stage of its manufacturing process which is useful in explaining the conventional manufacturing method.
Figure 5:
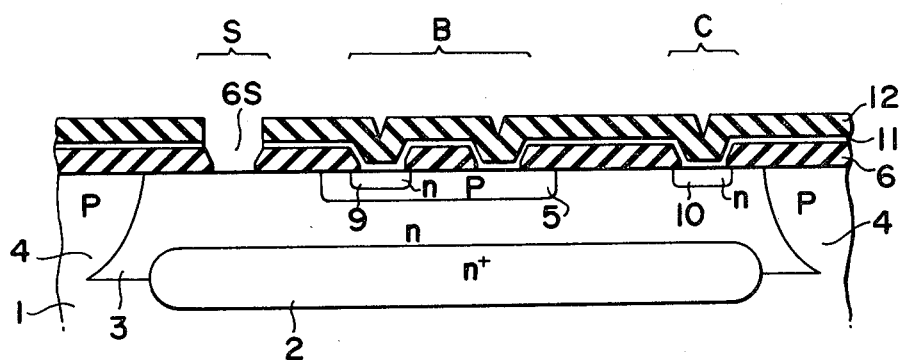
FIG. 5 is a cross-sectional view of said portion of the semiconductor device in still another subsequent stage of its manufacturing process which is useful in explaining the conventional manufacturing method.
Figure 6:
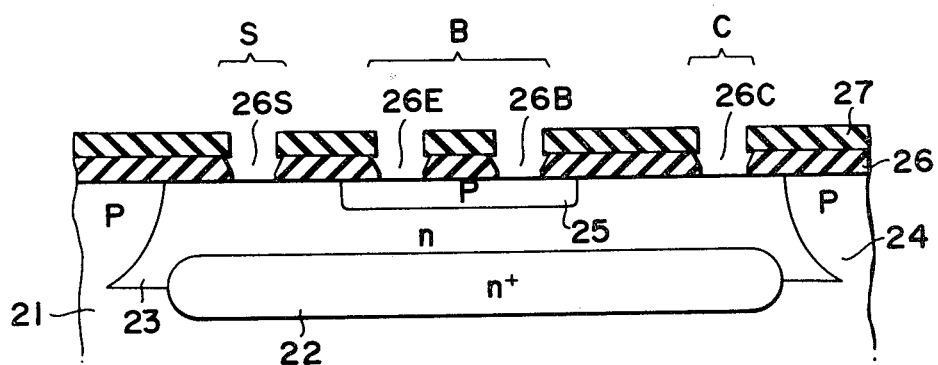
FIG. 6 is a cross-sectional view of a portion of a semiconductor device in a certain stage of its manufacturing process which is useful in explaining an embodiment of the present invention.

Referring to FIG. 6:

(1) On a silicon semiconductor substrate 21, an $n^+$-type buried layer 22 is formed, followed by the epitaxial growth of an n-type silicon semiconductor layer 23, on which are formed a p-type isolated region 24 contacting the substrate 21 and a p-type base region 25 and the surface is covered with a field oxide layer 26 having a thickness of 4,000–8,000 Å which is formed by the thermal oxidation method.

(2) The field oxide layer 26 is patterned by ordinary photolithography, with a photoresist layer 27 used as a mask, to provide complete windows 26S, 26E, 26B and 26C in which a Schottky barrier diode, an emitter, a base contact and a collector contact are to be formed, respectively. The photoresist layer 27 used can be of any type such as the positive type.

Figure 7:
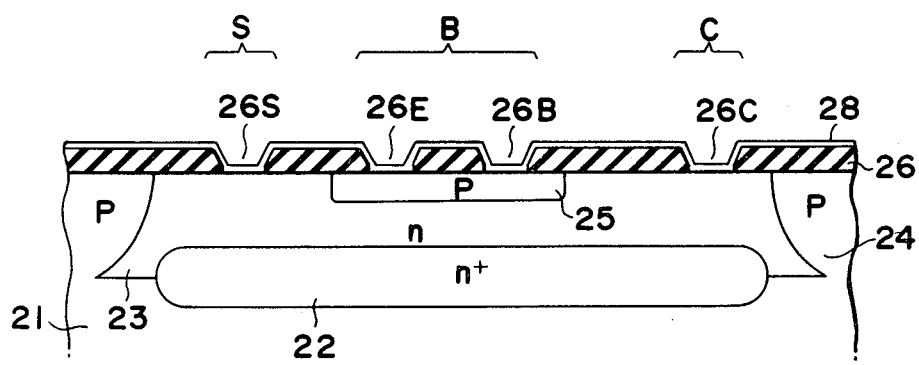
FIG. 7 is a cross-sectional view of said portion of the semiconductor device in a subsequent stage of its manufacturing process which is useful in explaining the embodiment of the present invention.

Referring to FIG. 7:

(3) After removal of the photoresist layer 27, a silicon layer 28 having a thickness of approximately 1,000 Å is formed by the chemical vapor growth method. The silicon layer 28 formed is polycrystalline or amorphous.

Figure 8:
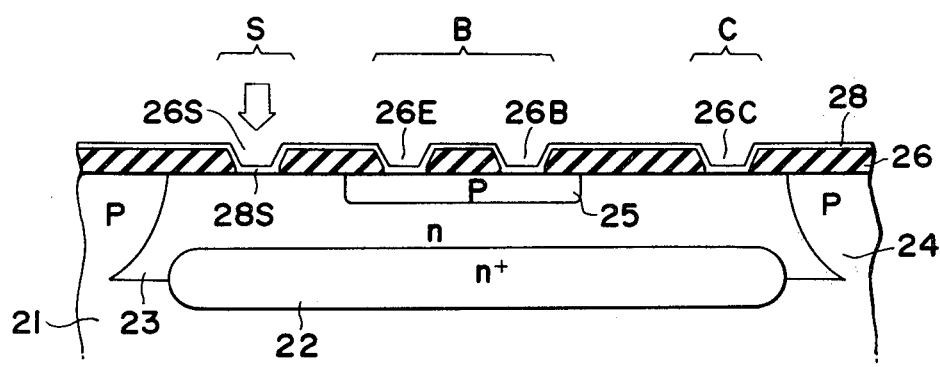
FIG. 8 is a cross-sectional view of said portion of the semiconductor device in another subsequent stage of its manufacturing process which is useful in explaining the embodiment of the present invention.

Referring to FIG. 8:

(4) The portion of the silicon layer 28 corresponding to the window 26S in which a Schottky barrier diode is to be formed is irradiated by an energy beam, such as a laser beam. The heated and melted silicon is recrystallized in the monocrystalline state. In this process, the top surface of the epitaxial layer 23 serves as a nucleus of the growth and the silicon layer 28 undergoes monocrystallization, starting from a portion thereof contacting the epitaxial layer 23 within the window 26S up to another portion thereof on the field oxide layer 26. In the Figure, the monocrystallized portion is shown by reference numeral 28S. If desired, it is a matter of course that the whole silicon layer 28 can be monocrystallized. If a Q-switch laser beam is used in heating the silicon layer, the irradiation thereby should be done once or more with the pulse width adjusted to a few scores of nanoseconds. If a CW-oscillated argon laser is used, the laser spot should be scanned to provide 10 to 60 J of heat per cm$^2$ of the irradiated area. The silicon layer 28 having a thickness of 1,000 Å melts at 20 to 30 l J/cm$^2$. The alternative energy beams that can be used are a thermal radiation beam, an electron beam and an ion beam.

Figure 9:
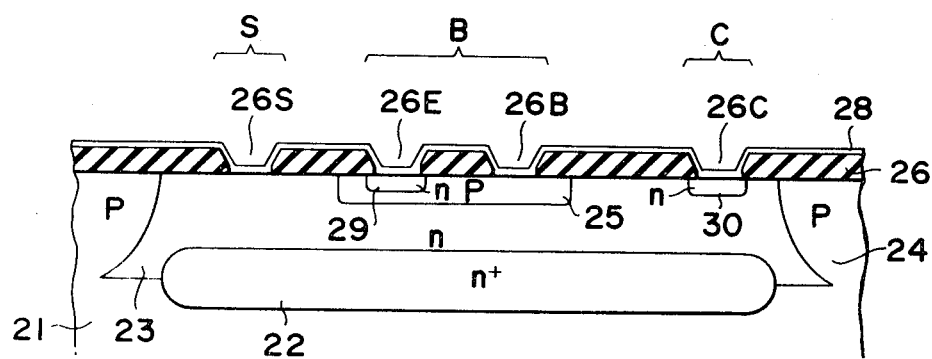
FIG. 9 is a cross-sectional view of said portion of the semiconductor device in still another subsequent stage of its manufacturing process which is useful in explaining the embodiment of the present invention.

Referring to FIG. 9:

(5) A phosphosilicate glass layer of approximately 5,000 Å thick is formed as a source of impurity diffusion by the chemical vapor growth method, which is then patterned by ordinary photolithography to leave this layer just in the windows 26E and 26C in which an emitter and a collector contact are to be formed, respectively, the rest of the surface being devoid of this material.

(6) An n-type emitter region 29 and an n-type collector contact region 30 are formed, with the phosphorus in the phosphosilicate glass layer diffused through the silicon layer 28 into the semiconductor layer 23, by a 800° C. heat treatment carried out for about 2 minutes in a nitrogen (N$_2$) atmosphere.

(7) The phosphosilicate glass layer is removed by the hydrofluoric acid (HF) etching.

Figure 10:
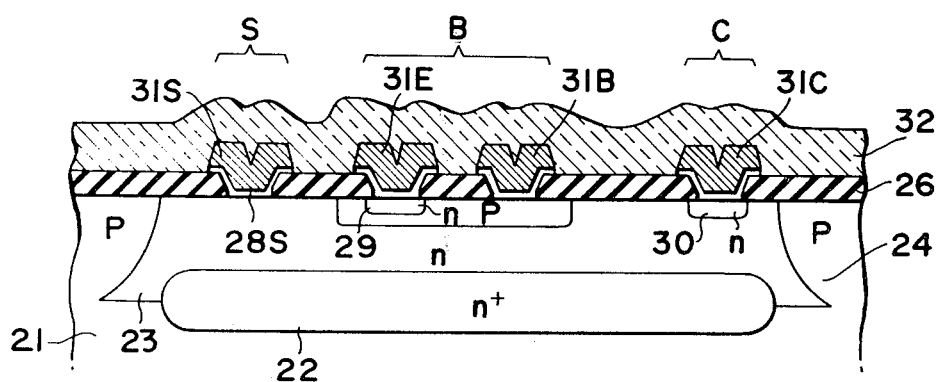
FIG. 10 is a cross-sectional view of said portion of the semiconductor device in still another subsequent stage of its manufacturing process which is useful in explaining the embodiment of the present invention.

Referring to FIG. 10:

(8) An aluminum (A1) layer having a thickness of 7,000–10,000 Å is formed by the sputtering method, which is then patterned by photolithography. Using this aluminum electrode as a mask, the silicon layer 28 is selectively etched to form a Schottky barrier diode electrode 31S, an emitter electrode 31E, a base electrode 31B and a collector electrode 31C.

(9) A cover of phosphosilicate glass layer 32 is formed by the chemical vapor growth method. This completes the manufacture of the desired semiconductor device.

It has been described herein that the emitter region 29 and the collector contact region 30 are formed by solid-solid diffusion, but these regions may also be formed by some other methods including ion implantation. This step of the semiconductor device manufacturing method may be carried out before the silicon layer 28 is formed.

By forming an electrode, such as an aluminum electrode as mentioned above, on the monocrystallized silicon layer in this manner, the same Schottky barrier is attained as one that is obtained by forming an aluminum electrode on ordinary monocrystalline silicon.

As is seen from the foregoing, the present invention provides a method of manufacturing a semiconductor device containing a Schottky barrier diode and a silicon layer which prevents reaction of the silicon with the aluminum involved, wherein no polycrystalline or amorphous silicon layer exists in the region in which the Schottky barrier diode is formed, and which is achieved without using two layers of photoresist mask material and which eliminates the step of etching a polycrystalline or amorphous silicon dioxide layer which is required in the conventional method. Any photoresist material can be used, including the positive type, which is more suitable for microfabrication than the negative type. Accordingly, a semiconductor device containing a Schottky barrier diode with an improved degree of circuit integration can be manufactured in the very simple process as described above.

What is claimed is:

1. A method of manufacturing a semiconductor device comprising the steps of:
   forming an insulating layer on a semiconductor substrate;
   selectively removing the insulating layer until the top surface of the semiconductor substrate is exposed to open a plurality of windows, including a window in which to form a Schottky barrier diode and windows in which to form electrodes;
   forming a polycrystalline or amorphous semiconductor layer covering the exposed surface of the semiconductor substrate and the remaining insulating layer;
   applying an energy beam to the polycrystalline or amorphous semiconductor layer at least in the window in which to form the Schottky barrier diode to convert the polycrystalline or amorphous semiconductor layer ito a single-crystal semiconductor layer;
   depositing a Schottky barrier diode forming metal layer on the single-crystal semiconductor layer to form a Schottky barrier contact between the metal layer and the single-crystal semiconductor layer; and
   depositing an electrode forming metal layer on the semiconductor layer in each of the windows in which to form electrodes to form an ohmic contact between the metal layer and the semiconductor layer.

2. The method of claim 1 wherein said energy beam is selected from the group consisting of a photon beam, an electron beam and an ion beam.

3. The method of claim 1 wherein the step of selectively removing the insulating layer comprises patterning the insulating layer using a single photoresist masking layer.

4. The method of claim 3 wherein the photoresist masking layer is of a positive type.

5. The method of claim 3 wherein the step of selectively removing the insulating layer further comprises removing the single photoresist masking layer prior to forming the polycrystalline or amorphous semiconductor layer.

6. The method of claim 1, 2, 3 or 4 wherein in the step of applying an energy beam, only the portion of the polycrystalline or amorphous layer around the window in which the Schottky barrier diode is to be formed is monocrystallized.

7. The method of claim 5 wherein in the step of applying an energy beam, only the portion of the polycrystalline or amorphous layer around the window in which the Schottky barrier diode is to be formed is monocrystallized.

* * * * *

UNITED STATES PATENT AND TRADEMARK OFFICE
CERTIFICATE OF CORRECTION

PATENT NO. : 4,377,031

DATED : March 22, 1983

INVENTOR(S) : Goto et al

It is certified that error appears in the above-identified patent and that said Letters Patent is hereby corrected as shown below:

Col. 3, line 7, " ₀portion" should be --portion--;

line 54, "A" should be --Å--.

Col. 4, line 9, " ₀1,000" should be --1,000--;

line 15, "A" should be --Å--.

Col. 5, line 21, "ito" should be --into--.

Signed and Sealed this

Fifteenth Day of November 1983

[SEAL]

Attest:

GERALD J. MOSSINGHOFF

Attesting Officer　　Commissioner of Patents and Trademarks